United States Patent [19]
Brodd

[11] Patent Number: 5,522,955
[45] Date of Patent: Jun. 4, 1996

[54] PROCESS AND APPARATUS FOR PRODUCING THIN LITHIUM COATINGS ON ELECTRICALLY CONDUCTIVE FOIL FOR USE IN SOLID STATE RECHARGEABLE ELECTROCHEMICAL CELLS

[76] Inventor: Ralph J. Brodd, 15845 LaPrenda Ct., Morgan Hill, Calif. 95037

[21] Appl. No.: 271,812

[22] Filed: Jul. 7, 1994

[51] Int. Cl.⁶ .................. C23C 14/04; C23C 14/24
[52] U.S. Cl. .......... 156/182; 156/306.3; 427/591; 427/592; 427/596; 427/597; 427/251; 427/255.2; 427/405
[58] Field of Search ................... 427/596, 591, 427/592, 597, 251, 255.2, 405; 156/223, 182, 306.3

[56] References Cited

U.S. PATENT DOCUMENTS

| | | | |
|---|---|---|---|
| 2,590,557 | 3/1952 | Melsheimer | 117/48 |
| 2,665,227 | 1/1954 | Clough et al. | 117/107 |
| 3,044,438 | 7/1962 | Osswald et al. | 118/49.1 |
| 3,241,519 | 3/1966 | Lloyd | 118/49 |
| 3,551,184 | 12/1970 | Dremann et al. | 117/50 |
| 3,683,847 | 2/1971 | Carleton | 118/48 |
| 3,745,095 | 7/1973 | Chadwick et al. | 204/15 |
| 3,868,106 | 2/1975 | Donckel et al. | 277/237 R |
| 3,895,129 | 7/1975 | Craig et al. | 427/81 |
| 3,928,681 | 12/1975 | Alaburda | 427/431 |
| 3,990,390 | 11/1976 | Plyshevsky et al. | 118/49 |
| 4,065,097 | 12/1977 | Timin | 251/228 |
| 4,184,448 | 1/1980 | Airchert et al. | 118/729 |
| 4,359,818 | 11/1982 | Zayatz | 29/623.1 |
| 4,502,903 | 3/1985 | Bruder | 156/153 |
| 4,594,229 | 6/1986 | Cook et al. | 429/129 |
| 4,615,961 | 10/1986 | Park et al. | 429/218 |
| 4,692,233 | 9/1987 | Casey | 204/298 |
| 4,693,803 | 9/1987 | Casey et al. | 204/298 |
| 4,730,383 | 3/1988 | Balkanski | 29/623.5 |
| 4,792,504 | 12/1988 | Schwab et al. | 429/192 |
| 4,818,643 | 4/1989 | Cook et al. | 429/188 |
| 4,824,746 | 4/1989 | Belanger et al. | 429/218 |
| 4,882,828 | 11/1989 | McLoughlin et al. | 29/623.1 |
| 4,892,559 | 1/1990 | Park et al. | 29/623.3 |
| 4,897,917 | 2/1990 | Gauthier et al. | 29/623.3 |
| 4,935,317 | 6/1990 | Fauteux et al. | 429/192 |
| 4,951,601 | 8/1990 | Maydan et al. | 118/719 |
| 4,969,254 | 11/1990 | Dahn et al. | 29/623.1 |
| 4,990,413 | 2/1991 | Lee et al. | 429/191 |
| 5,075,039 | 12/1991 | Goldberg | 252/518 |
| 5,169,446 | 12/1992 | Koksbang et al. | 118/69 |
| 5,186,594 | 2/1993 | Toshima et al. | 414/217 |
| 5,217,827 | 6/1993 | Fauteux et al. | 429/192 |
| 5,229,225 | 7/1993 | Shackle | 429/191 |
| 5,254,169 | 10/1993 | Wenk | 118/718 |
| 5,262,253 | 11/1993 | Golovin | 429/192 |

OTHER PUBLICATIONS

Bates et al., "Rechargeable Thin–Film Lithium Microbatteries," Solid State Technology, pp. 59–64 (Jul. 1993).

Takehara et al., "Thin Film Solid–State Lithium Batteries Prepared by Consecutive Vapor–Phase Process," J. Electrochem. Soc., 6:1574–1581 (1991).

*Primary Examiner*—Benjamin Utech

[57] ABSTRACT

The present invention provides a novel process and apparatus for coating electrically conductive substrate with alkali metal by vacuum metallizing. Novel methods and apparatus are provided to protect the alkali metal surface against atmospheric degradation. The alkali metal coated substrate prepared according to this invention can be used as an anode in electrochemical batteries.

38 Claims, 10 Drawing Sheets

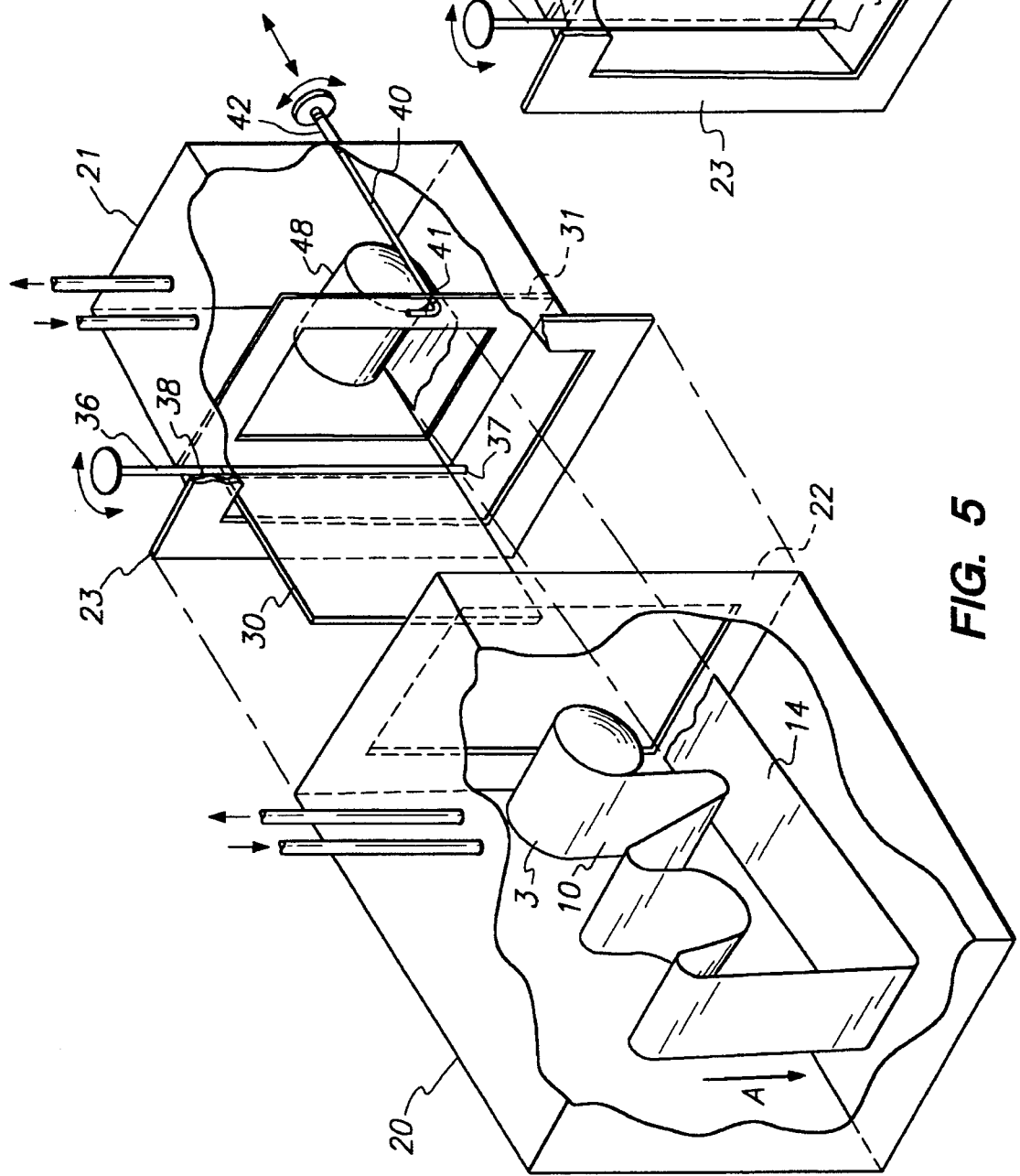

PROCESS AND APPARATUS FOR PRODUCING THIN LITHIUM COATINGS ON ELECTRICALLY CONDUCTIVE FOIL FOR USE IN SOLID STATE RECHARGEABLE ELECTROCHEMICAL CELLS

FIELD OF THE INVENTION

The present invention relates to the preparation of thin coatings of alkali metal on an electrically conductive foil. More particularly, the present invention relates to the preparation of thin alkali metal coatings on an electrically conductive substrate using vapor deposition and providing protection for the alkali metal coatings thus formed.

BACKGROUND OF THE INVENTION

Rechargeable batteries are widely used power sources, for example, in medical devices, calculators, computers, appliances, and automobiles. Batteries consisting of solid state rechargeable electrochemical cells are of great interest because they allow important reductions in size and weight compared with the more traditional type of battery.

Solid state rechargeable electrochemical cells are well known in the art. Typically, these cells are constructed in layers composed of an alkali metal foil anode (negative electrode), an ionically conducting solid polymeric electrolyte separator, and a composite cathode (positive electrode). Terminals are attached to the anode and cathode thus forming an electrochemical cell which is suitable for generating an electrical current. The cell may be sealed in a gas and liquid impervious membrane from which the terminals protrude. These solid state cells are of great commercial and technical interest because they are capable of generating a relatively high current per unit area, and have a high current capacity. Use of solid state rechargeable electrochemical cells results in important weight reductions, for example, in automobiles, which leads to improved automobile fuel efficiency.

See, e.g. U.S. Pat. No. 4,935,317 (Fauteux et al, 1990) (discloses typical composite cathode compositions and use of lithium coated metal foil as an anode) and U.S. Pat. No. 4,990,413 (Lee et al, 1991) (discloses ionically conductive polymers suitable for cathode compositions).

Extensive efforts continue to be devoted to the development of low cost, highly efficient thin film solid state rechargeable electrochemical cells. The use of very thin lithium electrodes of thickness of 2 microns or less is a particularly attractive objective since reduction in the thickness of the lithium anode layer results in a reduction of the cell size and weight, and lower material cost. Additional cost savings can be realized through the successful development of manufacturing techniques designed to producer lithium electrode sheets in continuous lengths or in large batches. The very high reactivity of lithium, which makes it a material of choice for anodes, has the disadvantage that the surface of the lithium anode is readily degraded by atmospheric compounds such as moisture, oxygen and nitrogen. While the completed cell is sealed against atmospheric compounds, special precautions need to be taken to minimize or, most desirably, completely avoid atmospheric degradation of the lithium surface during manufacture of lithium anodes and electrochemical cell assembly. Effective protection of the lithium surface is even more critical for the contemplated very thin lithium anodes because these anodes contain minimal quantities of lithium metal.

Thin lithium anodes are desirable because lithium is not consumed during the use of these types of cells. A very thin lithium anode is as effective as a thick anode, to meet the electrochemical requirements of a cell. It is well known to those skilled in the art that very thin lithium foil is difficult and expensive to manufacture. Also, thin lithium foil, e.g., less than 20 microns thick, is too soft to have sufficient physical integrity for the production of cells and for strong connections with the required terminals. Lithium coated on a metal foil such as copper, nickel, titanium, stainless steel, chrome plated steel and nickel plated steel offers an effective compromise between the desire for a very thin lithium layer and the requirement for sufficient physical integrity of the anode.

Many methods for coating lithium onto metal substrates are know in the art. See, e.g., U.S. Pat. No. 3,551,184 (Dremann et al., 1970) which involves rubbing a heated metal substrate with a rod of lithium. U.S. Pat. No. , 3,928,681 (Alaburda, 1975) discloses the coating of metal substrates as they are conveyed through an alkali metal melt. According to U.S. Pat. No. 4,824,746 (Belanger et al., 1989), lithium or lithium alloy is coated onto a metal substrate as the substrate is conveyed across a roller which is immersed in molten lithium or lithium alloy. U.S. Patent No. 5,169,446 (Koksbang et al., 1992) discloses the coating of lithium or other alkali metal on a metal substrate by contacting the substrate with molten lithium which is projected in the form of a standing wave. While these patents disclose methods for coating lithium on continuous lengths (such as sheet material that is handled in roll form) of a metal substrate such as foil, they all rely on thickness control by mechanical means. These mechanical means are thought to be insufficient to meet the requirement for highly reproducible thickness control of very thin coatings of alkali metals such as lithium of thickness less than 2 microns.

Reproducible thin coatings of lithium can be obtained by vacuum vapor deposition directly on very small stationery surfaces of solid state batteries. For example, Bates et al., "Rechargeable Thin-Film Lithium Microbatteries," Solid State Technology, pp.59–64 (July 1993) describes the preparation of thin film microbatteries wherein thin lithium anodes are prepared on solid inorganic glass electrolytes, such as lithium phosphorous oxynitride, by vacuum vapor deposition. The Bates batteries consist of successive layers of: cathode current collector, cathode, solid inorganic lithium electrolyte, lithium anode and a protective coating to protect the lithium anode. Takehara et al., "Thin Film Solid-State Lithium Batteries Prepared by Consecutive Vapor-Phase Process," J. Electrochem. Soc., 6:1574–1581 (1991), teaches the vacuum vapor deposition of thin lithium electrodes in the preparation of thin film solid state batteries with a total battery thickness of less than 20 microns. The effective surface area of these solid state lithium batteries was 49 $mm^2$. The lithium anode was deposited on a 1 micron thick plasma-polymerized solid polymer electrolyte film.

U.S. Pat. No. 4,730,383 (Balkanski, 1988) discloses a process for producing a solid state battery wherein the lithium anode is prepared by vacuum vapor deposition on solid inorganic lithium electrolyte, or on a metal substrate. The Balkanski '383 microbattery consists of consecutive layers of metallic contact, intercalation compound cathode, solid inorganic electrolyte, lithium anode, and metallic contact layer. This battery is prepared in an apparatus consisting of three high-vacuum chambers connected together by two high-vacuum lock chambers. The cathode, electrolyte and anode are deposited on one another by vacuum vapor deposition in the three high-vacuum chambers, wherein each material is deposited on the battery in a separate chamber in order to form high purity layers of thickness less than 1 micron.

It is well known to deposit relatively non reactive metals on continuous lengths of metal foil. See, e.g., U.S. Pat. No. 3,990,390 (Plyshevsky et al., 1976) (vacuum vapor deposition of chrome, aluminum, nickel, copper and titanium on continuous lengths of metal foil); U.S. Pat. No. 2,665,227 (Clough et al., 1954) (vacuum vapor deposition of aluminum on continuous lengths of flexible metallic or plastic substrates); U.S. Pat. No. 3,044,438 (Osswald et al., 1962) (vacuum metallizing apparatus wherein a material such as aluminum is vaporized and subsequently deposited on a continuous sheet material such as plastic film). Typically, these vacuum vapor metallizing methods consist of continuously moving a foil or sheet substrate past a source of metal vapor in a vacuum chamber. Usually, the substrate foil is cooled by passing the inner surface of the foil over a cooling drum at the point where the metal is deposited on the outside surface of the foil. Generally, the metal which is to be evaporated is added in a continuous manner to the source of metal vapor.

Equipment for vacuum metallizing of continuous lengths of flexible substrate may consist of multiple chambers. (See, e.g., U.S. Pat. Nos. 5,254,169 to Wenk, 4,693,803 to Casey and Plyshevsky '390). These patents do not however, disclose methods or apparatus for vacuum vapor deposition of alkali metals such as lithium or highly corrosive metals with similar low melting temperatures, on continuous lengths of metal foil.

Regardless of the method used in coating a substrate with lithium or other alkali metal, steps must preferably be taken to prevent the lithium from reacting with the atmosphere.

Lithium is generally known to readily react with atmospheric compounds such as moisture, oxygen and nitrogen. Once the lithium surface has been chemically altered, it is a less effective surface for an electrochemical cell. It is thus important to protect the lithium surface from contamination or chemical attack during the manufacturing of these cells. This protection is particularly important where very thin lithium films (i.e., 2 micron thickness or less) are used as anodes.

The need to protect lithium anode surfaces is well known to those skilled in the art of making solid state rechargeable electrochemical cells. See, e.g., U.S. Pat. No. 4,502,903 (Bruder, 1985) disclosing a lithium anode film which is protected by laminating it with a conductive plastic substrate. The lithium surface is freshly prepared, e.g., by extrusion, in an argon atmosphere. A sheet of conductive plastic is laminated to one side of the lithium film under pressure and heat to obtain adhesion between the lithium surface and the conductive plastic which serves as an anode current collector. This method protects the outer side of the lithium film; but not the side which forms the cell's electrochemically active side.

U.S. Pat. Nos. 4,594,299 (Cook et al., 1986) and 4,818,643 (Cook et al., 1989) disclose a lithium anode film protected by a polymeric electrolyte.

Accordingly, the need exists for a method and apparatus to vacuum metallize alkali metal such as lithium on continuous lengths of metal substrate and protect the thin coating of alkali metal so obtained from reaction with a normal atmosphere.

SUMMARY OF THE INVENTION

The present invention provides a process and apparatus for vacuum metallizing alkali metals such as lithium onto continuous lengths of electrically conductive substrate for use in solid state rechargeable electrochemical cells, and for coating the vacuum metallized substrate with polymeric layers suitable for use in these cells.

In one embodiment the present invention provides a process and apparatus for vacuum metallizing alkali metal onto continuous lengths of electrically conductive substrate.

In another embodiment the present invention provides a method and apparatus for processing, storing and transporting the vacuum metallized electrically conductive substrate without exposing the metallized coating to contamination or attack by atmospheric compounds.

In a further embodiment, the present invention provides a process and apparatus for coating the alkali metal surface of continuous lengths of vacuum metallized electrically conductive substrate in a noble gas environment, with polymeric electrolyte suitable for use as a separator in electrochemical cells.

In a further embodiment, the present invention provides a process and apparatus for coating the alkali metal surface of continuous lengths of vacuum metallized electrically conductive substrate in a noble gas environment, with aprotic solvent.

In a further embodiment, the present invention provides a process and apparatus for laminating the alkali metal surface of continuous lengths of vacuum metallized electrically conductive substrate in a noble gas environment, with a laminate consisting of a cathode layer and a electrolytic separator layer suitable for use in electrochemical cells.

In a further embodiment, the present invention provides an electrochemical cell anode prepared by vacuum metallizing alkali metal onto continuous lengths of electrically conductive substrate from which multiple anodes can be cut.

In a further embodiment, the present invention provides an electrochemical cell anode prepared according to the instant invention and coated with polymeric electrolytic separator or laminated with a laminate consisting of a layer of cathode compound and a layer of polymeric electrolytic separator.

These and other embodiments of the invention are described in detail and illustrated below.

BRIEF DESCRIPTION OF THE DRAWINGS

FIG. 5 is an exploded perspective view, with parts broken away, of the vacuum metallizing apparatus illustrated in FIG. 3.

FIG. 6 is a perspective view, with parts broken away, of the closed detached chamber illustrated in FIG. 4.

DETAILED DESCRIPTION OF THE INVENTION

While describing the invention and its embodiments, certain terminology will be utilized for the sake of clarity. It is intended that such terminology include not only the recited embodiments, but all technical equivalents which perform substantially the same function, in substantially the same manner to achieve substantially the same result.

Definitions

For the purposes of this invention, the following terms are given special definitions.

The term "battery" may include a single cell, or a plurality of cells connected in either series or parallel fashion to furnish electrical current.

The term "cell" includes an anode layer, an electrolyte layer, a cathode layer and electrically conductive terminals connected to the anode and the cathode; included are cells consisting of a plurality of these layers connected in bifaced, bipolar, or other cell configurations known in the art.

The term "solid state" includes polymeric compositions containing a liquid interpenetrating network.

The term "noble gas" includes argon, helium, krypton, neon, radon and xenon. These gases are also known as inert gases or rare gases.

I. Vacuum Metallizing Alkali Metals on Continuous Lengths of Metal Substrate

Figure 1:
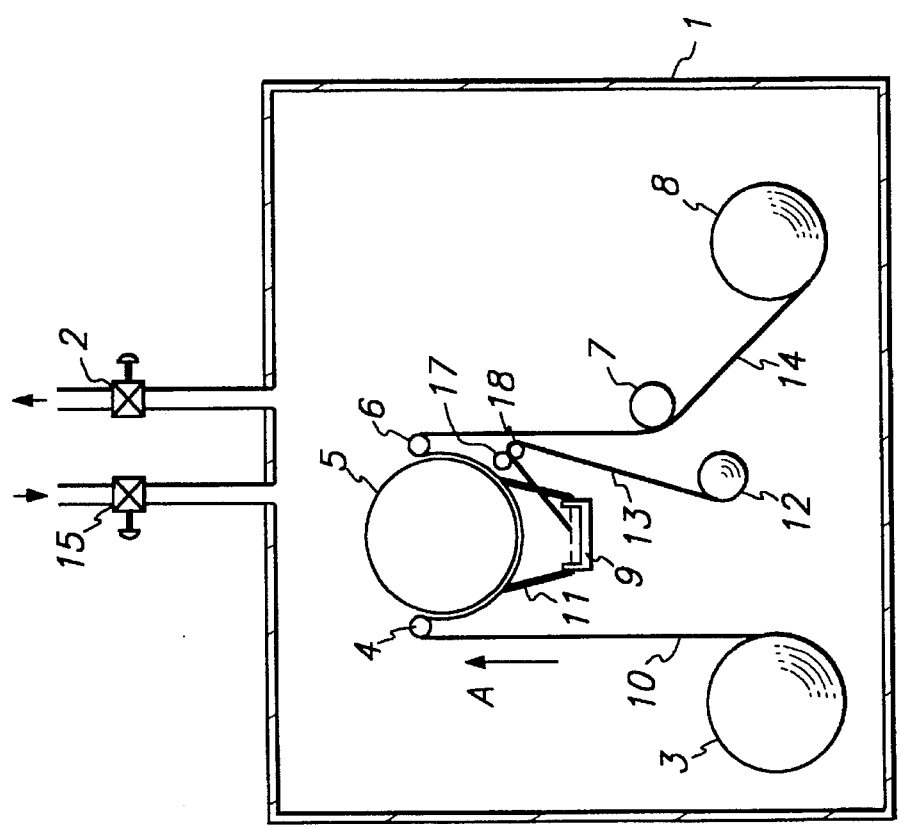
FIG. 1 is a schematic cross-sectional view illustrating an apparatus of the present invention for the vacuum metallizing of continuous lengths of metal substrate.

The process and apparatus according to one embodiment of the present invention is shown in FIG. 1. The vacuum chamber 1 is mounted on appropriate supports (not shown). Vacuum chamber 1 has gas impervious walls and appropriate sealable openings (not shown) to load and unload the chamber. A supply roll 3 of suitable metal substrate 10 is placed inside the chamber 1.

The metal substrate 10 includes the following metals: copper, nickel, titanium, stainless steel, chrome plated steel and nickel plated steel. The preferred metal substrate 10 is copper. The thickness of the metal substrate ranges from about 8 microns to about 25 microns. The preferred thickness ranges from about 10 microns to about 12 microns. The width of the metal substrate 10 is not critical; it is determined by commercial availability and the dimensions of the metallizing equipment.

The substrate 10 can be guided over a transfer roll 4, around a quench drum 5, over a transfer roll 6, then optionally over a tension roll 7, and onto a take-up roll 8. The rolls 3 and 8 can be mounted on spindles (not shown) which protrude through the walls of the vacuum chamber 1 in order to facilitate winding and tensioning of the substrate 10. If the spindles for rolls 3 and 8 protrude through the chamber walls, they are preferably fitted with vacuum tight rotary shaft seals which are known to those skilled in the art, such as lip seals (also known as Wilson seals) which provide high vacuum seals for rotary shafts through tightly fitting rubber connections.

The quench drum 5 may be stationary or rotating. Cooling liquid such as cold water can be passed through the quenching drum via a hollow shaft which passes through the walls of the chamber 1 and which is operatively connected to the center of the drum and which passes through the walls of the chamber 1. The hollow shaft can also be utilized as a drive shaft for quench drum 5 if the drum is used in a rotating mode. The hollow shaft can be equipped with rotary shaft seals, such as Wilson seals, where the shaft passes through the walls of the chamber 1, if the shaft is used in a rotating mode with a drive mechanism (not shown) positioned outside the chamber 1.

Within the chamber 1 is mounted a container or crucible 9 in which is contained the lithium or other alkali metal which is to be evaporated for coating the substrate 10. The crucible 9 is placed on suitable supports (not shown) and is heated by heating means known to those skilled in the art including electrical induction heating, electron beam heating, electrical resistance heating or laser heating. The opening of the crucible 9 is preferably placed directly underneath the lower portion of the quench drum 5. Optionally, a shield 11 may be placed between the crucible 9 and the lower surface of the quench drum 5. The shield 11 assists in restricting metal vapor to the area between the container 9 and the quench drum 5.

A coil 12 of wire, strip of film 13 of lithium or other alkali metal can be fed through feed rolls 17 and 18, through an opening in the optional shield 11 into the container or crucible 9 to provide a continuous supply of lithium. If the drive shafts (not shown) of the feed rolls 17 and 18 extend through the walls of the vacuum chamber 1, they should be provided with rotary vacuum seals such as Wilson seals.

Alternately, ingots or rods of alkali metal can be continuously added to container 9.

Valve 15 can be utilized to control the flow of air or other gases into the vacuum chamber 1. Valve 2 can be used to control the application of a vacuum for evacuating the chamber 1.

Referring to FIG. 1, alkali metals and most preferably lithium can be vacuum metallized onto the metal substrate 10 in the following manner. The supply roll 3 of metal substrate 10 is mounted for rotation inside the vacuum chamber 1. The substrate is guided from the supply roll 3 over the transfer roll 4, around the quench drum 5, over the transfer roll 6, under the tension roll 7, and onto take-up roll 8. The coil 12 of lithium or other alkali metal is mounted for rotation and the wire, strip or film 13 is guided through feed rolls 17 and 18 into the crucible 9. Valve 15 and all openings of the vacuum chamber 1 are sealed.

Figure 2:
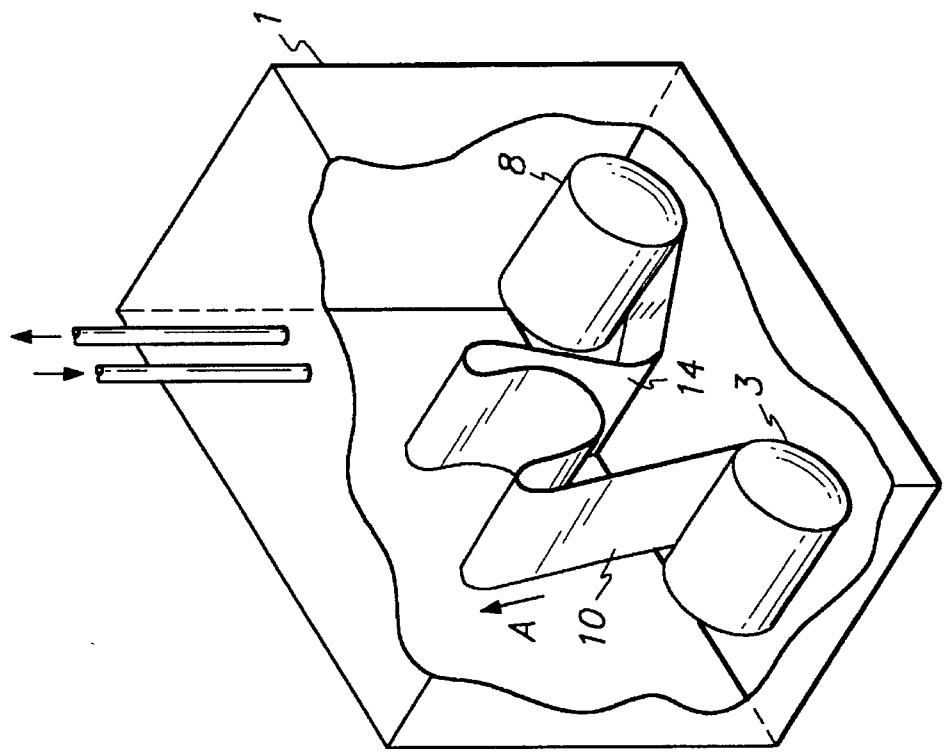
FIG. 2 is a perspective view, with parts broken away, of the position of the substrate in the vacuum metallizing apparatus illustrated in FIG. 1.

A vacuum is applied to the chamber 1 through the control valve 2. The vacuum should be at least $10^{-3}$ Torr; more preferably, the vacuum should be at least $10^{-5}$ to $10^{-6}$ Torr. The vacuum means (not shown) which are appropriate for these vacuum ranges are known to those skilled in the art; these means include vacuum diffusion pumps and ion pumps. The metal 13 in the crucible 19 is heated to vaporize the metal 13. Due to the high vacuum in the chamber and the temperature differential between the container 9 and the metal substrate 10 in contact with the quench drum 5, the vapor of the metal 13 moves in substantially straight lines from the crucible 9 to the metal substrate in contact with the quench drum 5. The metal 13 is fed continuously into the crucible 9 during the vapor deposition process to replenish evaporated metal. The substrate 10 is moved continuously at a controlled speed through the metal vapor generated by crucible 9. Arrow A indicates the direction in which the metal foil moves through the vacuum chamber 1. FIG. 2 illustrates the path of the metal foil through the chamber 1.

The vacuum metallizing process is continued until all metal substrate has been coated with lithium or other alkali metal, and all coated substrate is collected on take-up roll 8. Upon cooling to ambient temperature, valve 2 is closed and a noble gas such as Ar, He, Ne, Kr, Rn or Xe, or other gases which will not react with the alkali metal coating can be admitted to the chamber 1 through control valve 15.

The coated substrate produced using this method, such as lithium coated copper foil, for example, is suitable for anodes which are used in solid state rechargeable electrochemical cells. The spooled foil of alkali metal coated substrate may be stored inside the vacuum chamber 1 under vacuum or in a non-reactive gas such as noble gas, to prevent contamination or chemical attack prior to use of the anode surface in the manufacture of electrochemical cells. Alternately, the spooled foil may be removed from the vacuum chamber 1 and immediately placed in a sealed container (not shown) under a noble gas blanket. This removal and storage procedure entails minimal exposure to atmospheric attack or contamination.

In an alternate configuration (not shown) of the vacuum chamber 1, the supply roll 3 may be placed outside the chamber 1 and fed through an appropriate seal (not shown) in the wall of the vacuum chamber 1 to the transfer roll 4. Examples of such seals are provided in U.S. Pat. Nos. 5,254,169 (Wenk, 1993) (tubular gasket seal) and 3,868,106 (Donckel et al., 1975) (a vacuum gate seal).

The process and apparatus of the present invention can be used to either vacuum metallize one surface of the substrate or both sides of the substrate by passing the foil through vacuum metallizing twice, providing the substrate surface is electrically conductive.

As shown in U.S. Pat. No. 2,665,227 (Clough et al., 1954), which is herein incorporated by reference, the metal substrate may alternately be guided along several quenching drums utilizing either a single vapor source or several vapor sources.

EXAMPLE

Lithium was vacuum metallized onto copper foil in a vacuum chamber similar to the vacuum chamber 1 illustrated in FIG. 1.

Two resistance heated 415 mm long molybdenum strips were mounted in the crucible 9, approximately 90 mm below a 196 mm diameter water cooled quenching drum 5. Copper foil approximately 2.5 micron thick, approximately 300 mm wide and approximately 600 mm long was tensioned and taped around the cylindrical outside of the quench drum 5. Cleaned lithium foil pieces of approximately 1.5 mm thick, approximately 25 mm long and approximately 16 mm wide were placed on the molybdenum resistance strips of the crucible 9.

The vacuum chamber 1 was evacuated by a suitable vacuum pump to a pressure of approximately $1.3 \times 10^{-4}$ Torr. Outgassing was continued for approximately 30 minutes. The resistance heat source (molybdenum strips) of the container 9 was gradually brought up to lithium evaporation temperature during approximately 5 minutes, at which point the molybdenum strips were still at black heat (i.e. not hot enough to visibly glow). During lithium evaporation, the quenching drum 5 was rotated slowly by appropriate means (not shown). Rotation of the drum 5 was continued until all the lithium had evaporated. During evaporation of lithium, the vacuum ranged from approximately $2.6 \times 10^{-5}$ Torr to approximately $4 \times 10^{-5}$ Torr.

The vacuum chamber 1 was vented with argon following lithium vacuum metallizing. Next, the copper foil was removed from the quench drum 5. Several samples were treated according to the above procedure. Upon inspection of the copper foil, it was found that the exposed surface of the copper was coated with lithium in a thickness range of approximately 12 microns to approximately 30 microns.

The example demonstrates that the method and apparatus of the present invention is suitable for vacuum metallizing of lithium onto continuous lengths of a substrate such as a continuously moving metal foil.

Further embodiments of the present invention are illustrated in FIGS. 3 through 6. These additional embodiments differ from the embodiment illustrated in FIGS. 1 and 2 mainly in the use of a removable chamber for collecting and storing the take-up roll of vacuum metallized metal substrate in a noble gas or a vacuum.

Figures 3, 4:
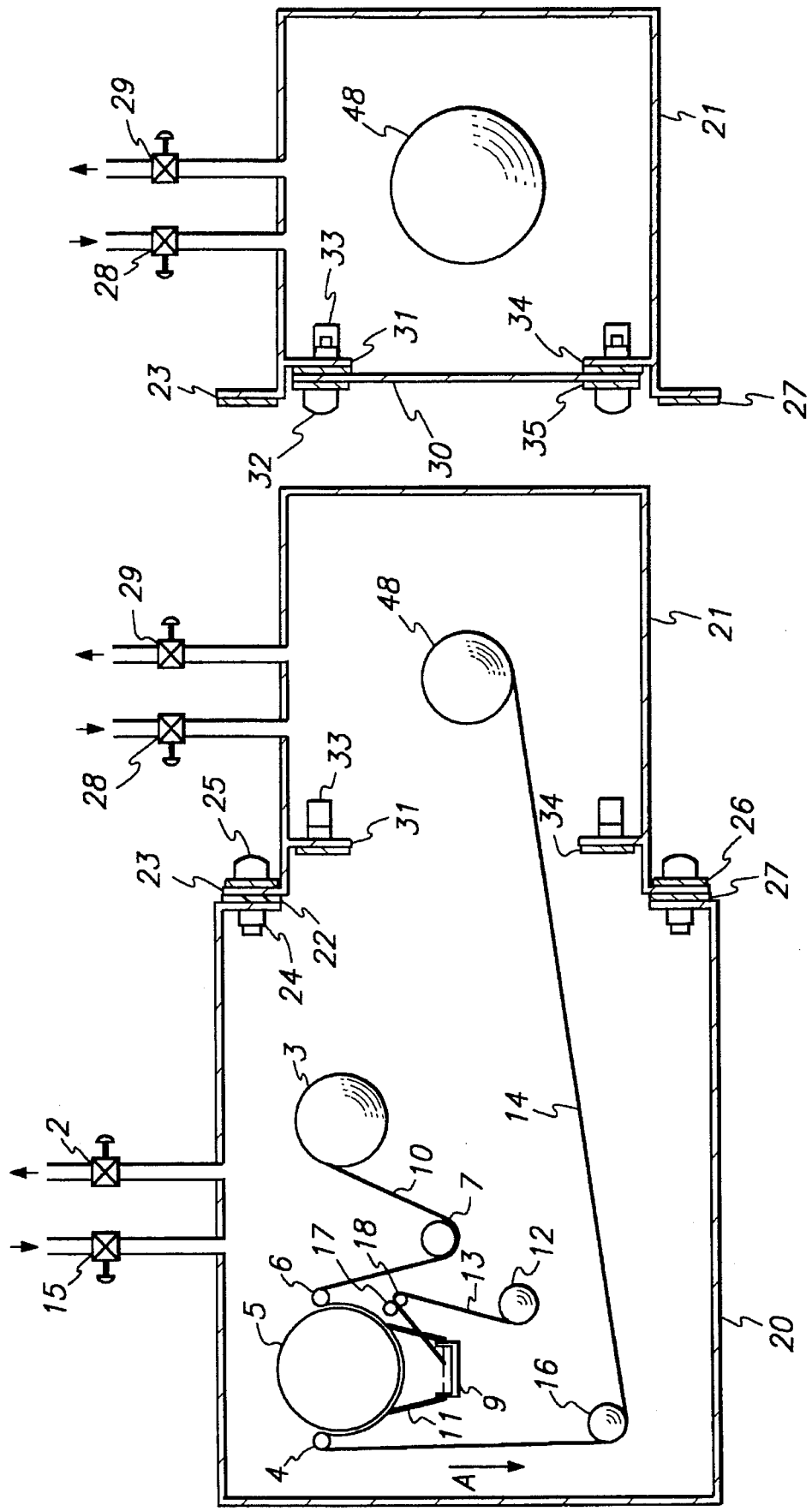
FIG. 3 is a schematic cross-sectional view illustrating an apparatus of the present invention including a vacuum chamber equipped with a detachable chamber.
FIG. 4 is a schematic cross-sectional view illustrating the detachable chamber of FIG. 3 in a detached and closed position.

The vacuum metallizing equipment illustrated in FIG. 3 consists of a vacuum chamber 20 and a removably attached vacuum chamber 21. Shoulder 22 of the chamber 20 provides a sealing surface for engaging rim 23 of the chamber 21. Appropriate fasteners and seals are used to removably attach and seal chamber 20 to chamber 21. For example, a plurality of nuts 24 and matching bolts can be used for fastening chamber 21 to chamber 20 through matching holes in shoulder 22 and rim 23. Appropriate seals 26 and 27 for sealing chamber 20 to chamber 21 conform to the sealing surface formed by shoulder 22 and can be constructed from for example, nitrile, chloroprene, chlorosulfonated polyethylene and vinylidene fluoride or hexafluoropropylene elastomers. Control valves 28 and 29 provide for independent application of gas and vacuum respectively to the chamber 21.

The method and equipment for metallizing illustrated in FIG. 3 is similar to the method illustrated in FIG. 1. The vacuum metallized metal foil is moved around transfer roll 16 and onto the take-up roll 48 in chamber 21 shown in FIG. 3. Upon completion of vacuum metallizing and spooling of the metallized foil on roll 48, valve 25 is closed and a noble gas is admitted through valve 15, to atmospheric pressure. As shown in FIG. 5 and 6 a hinged door 30 is closed by rotating knob 36 and locking in a closed position by rotating a latch 41 using a knob 42 so that latch 41 prevents door 30 from opening. A noble gas is applied to chamber 21 through the control valve 28 to maintain a slightly positive noble gas pressure in the chamber 21, as compared with atmospheric pressure. Turning again to FIGS. 3 and 4, the fasteners such as bolts 25 and nuts 24 are then removed, separating the chamber 21 from the chamber 20. During removal of chamber 21, a noble gas environment is maintained in this chamber to protect the alkali metal coating from substantially all contamination or attack by moisture or air.

Preferably, door 30 should be sealed on rim 31 in a gas tight manner to maintain a noble gas environment in chamber 21, or alternately to maintain a vacuum in chamber 21, to protect the coated substrate during storage in chamber 21. The seal between door 30 and rim 31 obtained by means of latch 41 can be further tightened by placement of additional door fasteners immediately following removal of chamber 21 from chamber 20. Additional door fasteners, as illustrated in FIGS. 3 and 4, may consist of a plurality of bolts 32 and sleeves 33 threaded to receive bolts 32. A first open end of sleeve 33 is attached to rim 31 by any suitable fastening means such as welding, brazing, soldering or adhesive bonding, providing a gas tight seal between sleeve 33 and rim 31. A second end of sleeve 33 is permanently closed and sealed. Matching holes in rim 31 and door 30 allow for fastening bolts 32 and sleeves 33. Suitable seals 34 and 35 for sealing door 30 on the rim 31 are similar to the materials described for the seals 26 and 27.

Fasteners 32 and 33 can be used to insure a vacuum tight seal between door 30 and chamber 21 in the following manner. Upon completion of vacuum metallizing, door 30 is closed and latched as described above. When chamber 21 is removed from chamber 20 air and moisture contamination of chamber 21 can be prevented, if door 30 does not provide a completely gas tight seal, by filling chamber 21 with noble gas through valve 28 at slightly positive pressure. The sealed construction and attachment of sleeves 33 to rim 31 prevents any substantial gas leakages through the sleeves 33. Once chamber 21 has been completely removed from chamber 20, bolts 32 can be tightened in sleeves 33 to compress door 30 tightly against seal 34 to provide a vacuum and gas tight seal between door 30 and rim 31.

Closure means other than the door 30 may also be used to close the chamber 21. A vacuum sealed sliding valve, such as disclosed in U.S. Pat. No. 4,065,097 (Timin, 1977), is a suitable alternate closure means.

Alkali metal coated foil produced during this process is suitable for anodes which are used in solid state rechargeable electrochemical cells. The coated foil may be stored on its take-up roll 48 in the chamber 21 in noble gas supplied via control valve 28 or under vacuum applied through control valve 29. The vacuum metallized foil is thus protected from contamination or attack by atmospheric compounds. The chamber 21 can be used to store the coated foil, to transport the foil to another location for subsequent processing, or for attachment to additional processing equipment.

II. Protection of Vacuum Metallized Coatings of Lithium by Coating with Polymeric Electrolyte Further processing of the alkali metallized foil is highly desirable to protect it from the atmosphere. Such processing preferably includes some or all of the processing steps to create an electrochemical cell. Examples of preferable processing steps are (1) coating the alkali metal surface of the foil with an ionically conducting polymeric compound suitable for use as an electrolytic cell separator or (2) laminating the alkali metal surface to the polymeric electrolyte layer of a cathode laminate consisting of a cathode layer and a polymeric electrolyte layer.

Polymerizable monomer useful in the electrolyte compositions may consist of either a conductive or a non-conductive matrix. U.S. Pat. No. 4,935,317 (Fautcux et al., 1990), herein incorporated by reference, discloses that preferred monomers are polyethylenically unsaturated compounds having at least one, and preferably a plurality of heteroatoms (particularly oxygen and/or nitrogen atoms) capable of forming donor acceptor bonds with alkali metal cation and which arc terminated by polymerizable moicties. Upon polymerization, these compounds yield a conductive supportive matrix which seals and protects the surface of the alkali metal anode. Preferred polymerizable compounds arc obtained by macting a polyethylene glycol with acrylic or methacrylic acid. Examples of suitable polymers resulting in a non-conductive supportive matrix arc acrylated cpoxics, polyester acrylatcs and N-vinylpyrrolidone.

Polymeric electrolyte ionic conductivity may be obtained by using conductive salt solution or conductive polymer to prepare the electrolyte. Fauteux '317 discloses many ionizable alkali metal, alkaline earth and ammonium salts which are suitable conductive salts. Lithium salts arc particularly preferred. Fautcux teaches that suitable aprotic solvents to dissolve the salt should have low volatility. Typically, suitable solvents have a boiling point greater than 80° C. Examples of suitable solvents are polyethylene glycol dimethyl ether (PEGDME) and propylene carbonate. Accordingly, conductive salt and aprotic solvent are mixed in a salt/solvent weight ratio range of about 1/20 to about 1/60 to completely dissolve the salt in the solvent. Conventional liquid mixing equipment may be used to prepare the ionically conductive salt solution.

An appropriate polymeric monomer chosen from those discussed above is mixed with an appropriate conductive salt solution chosen from those discussed above. A preferred weight ratio range of solvent/monomer ranges from about 1/1 to about 4/1. Conventional liquid mixing equipment is suitable for this mixing step.

Other polymeric electrolytes can be used. See, e.g., U.S. Pat. Nos. 5,217,827 (Fauteux et al., 1993), 5,229,225 (Shackle, 1993) and 5,262,253 (Golovin, 1993) all of which are incorporated herein by reference.

Preparation of the polymeric electrolyte according to the present invention is completed by polymerization of the monomer. The type of polymerization depends on the monomer which is used. Radiation polymerizable monomers which are polymerized using electron beam radiation are disclosed in Fauteux '317. Heat polymerizable monomers using thermal initiators are disclosed in U.S. Pat. No. 4,792,504 (Schwab et al., 1988), incorporated herein by reference.

Figure 7:
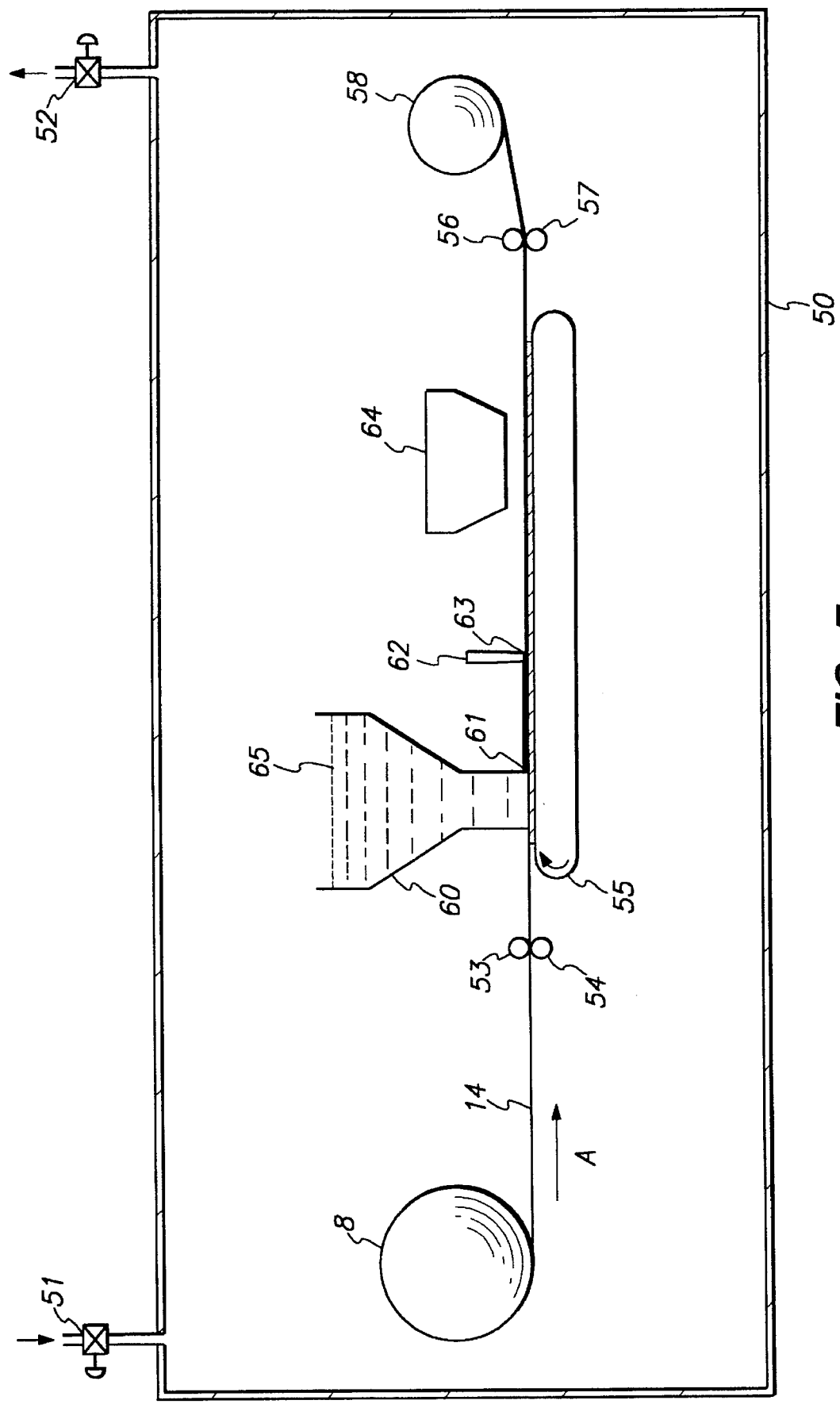
FIG. 7 is a schematic cross-sectional view illustrating an apparatus for coating of vacuum metallized substrate with polymeric electrolytic separator in a noble gas environment.
Figure 8:
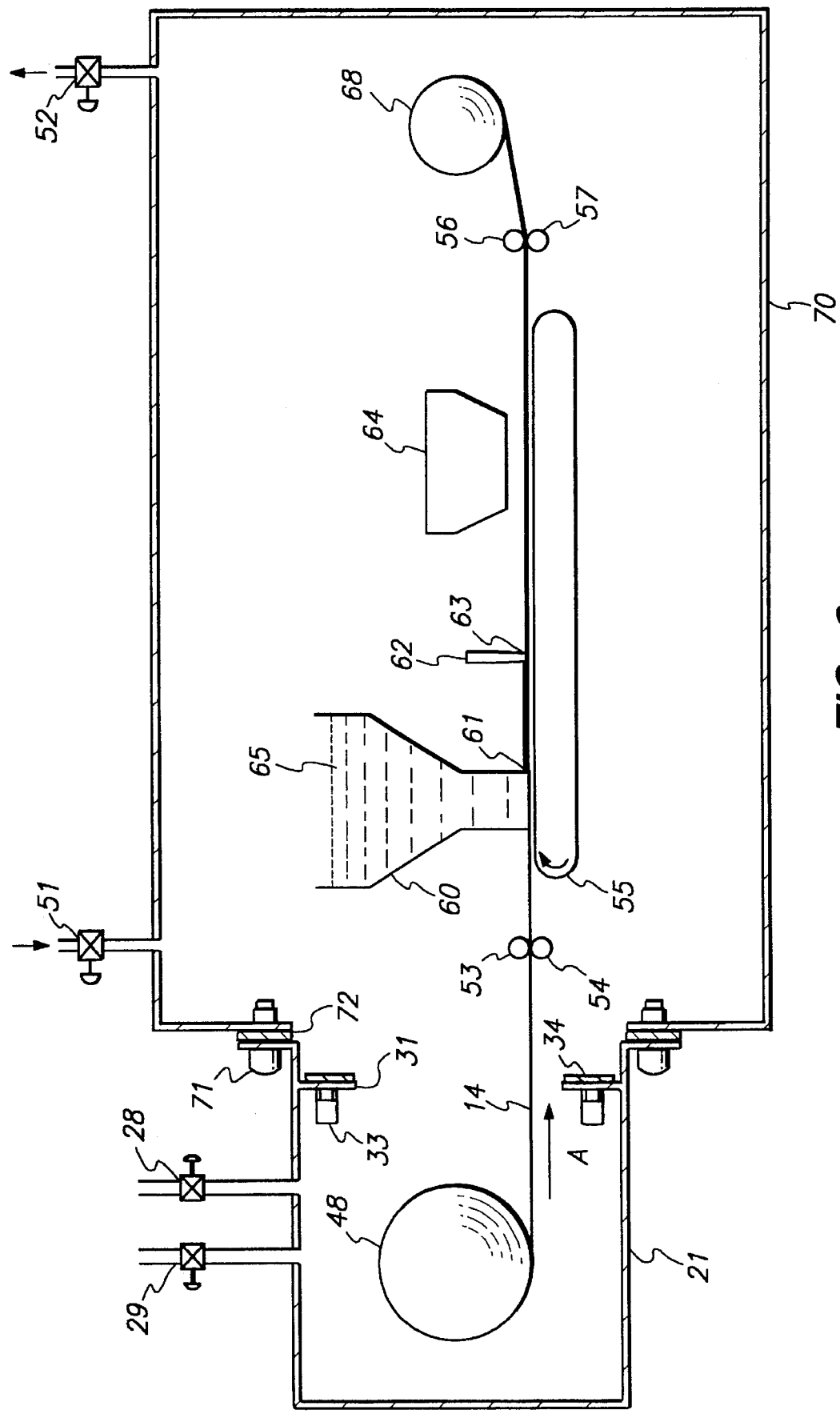
FIG. 8 is a schematic cross-sectional view illustrating an apparatus for the polymeric electrolyte coating of substrate which is collected and stored in the detachable chamber illustrated in FIGS. 4 and 6.

FIGS. 7 and 8 illustrate a method and apparatus for applying a polymeric electrolyte protective coating on the lithium or other alkali metal surface of the coated metal foil. The apparatus shown in FIG. 7 consists of a chamber 50, suitable for maintaining a non-reactive gas environment such as, for example, a noble gas environment. The non-reactive gas may be admitted to the chamber 50 through the control valve 51 and vented through the control valve 52.

The spool 8 of coated metal foil can be removed from the sealed chamber 1 (FIG. 1) or from a sealed noble gas container (described in connection with Figures 1 and 2) and loaded onto a spindle (not shown) in chamber 50. The coated metal foil 14 is guided through guide rolls 53 and 54 onto a continuous conveyor belt, through guide rolls 56 and 57 to a take-up roll 58. The take-up roll 58 can be provided with an appropriate drive mechanism (not shown). The drive shaft (not shown) of take-up roll 58 can extend through the wall of the chamber 50 utilizing suitable rotary seals such as Wilson seals. The spool 8 is loaded so that the alkali metal coating on the metal foil 14 is on the upper side of the foil, with the metal foil substrate being in contact with the conveyor 55. The conveyor 55 has suitable supports (not shown) and can be provided with a suitable drive mechanism (not shown).

FIG. 8 illustrates a preferred polymer coating process using a chamber 70 having an end adapted to receive a sealed container 21 as shown in FIG. 4. The chamber 21 can be connected to chamber 70 as illustrated in FIG. 8. For example by bolting chamber 21 to chamber 70 using bolts 71 which are tightened to engage the seals 72. Once substantially all air and moisture is removed from chamber 70, the door 30 of the chamber 21 is opened by rotating the cross bar 41 away from the door 30, and opening the door 30 by rotating the door hinge pin 36 as shown in FIGS. 5 and 6. Control valves 28, 51 and 52 can be closed to maintain a noble gas environment in communicating chambers 70 and 21. This apparatus assures the alkali metal will not be exposed to contamination or atmospheric attack at any point, which should provide cells with the greatest potential for highly effective electrochemical cell performance.

A container 60 for holding the polymeric coating compound can be provided with an opening at its bottom which is positioned above and extends across substantially the entire width of the metal foil 14. The bottom edges of the container 60 are equipped with seals such that each seal makes contact with the metal foil along both edges of the foil and along the foil at the point where the foil 14 enters under the container 60. The edge of the container 60 where the foil 14 leaves the container 60 preferably includes an adjustable gate 61 which can be raised or lowered for variations in the desired thickness of the polymerizable electrolyte coating applied to the top surface of the foil 14. The container 60 is supported by appropriate means (supports not shown).

A doctor blade 62 can be positioned downstream from the container 62. The doctor blade is adjustably supported (supports not shown) to control the thickness of the polymeric electrolyte coating deposited on the alkali metal surface of foil 14. A radiation curing unit 64 can be placed downstream from the doctor blade 62 and over the coated foil. The radiation unit 64 (supports not shown) provides ultra-violet, heat or electron beam radiation, depending on the type of polymerization which is required to cure the specific polymerizable electrolyte composition selected.

To use this apparatus to coat alkali metal coated foil, one places a polymerizable electrolyte mixture containing monomer, ionically conductive salt and aprotic solvent described above, in the container 65. The chamber 50 is sealed and flushed with noble gas through the valves 51 and 52. As soon as the chamber 50 is substantially free from air and moisture, the vacuum metallized foil 14 is moved from take-up roll 8 over the conveyor belt 55 to the take-up roll. The adjustable gate 61 is raised to allow a desired thickness of the polymerizable electrolyte mixture to flow from the container onto the coated side of the metal foil 14. The height of the doctor blade 62 is adjusted to assure deposition of the desired coating thickness of the electrolyte layer.

The radiation unit 64 is activated to provide radiation of the appropriate type and intensity to polymerize the monomer. The foil 14 with polymerized coating of electrolytic separator is collected on the take-up roll 58. Alternately, a suitable release film (not shown) may be applied to the surface of the polymerized coating before spooling on the take-up roll 58 to separate the surface of the polymeric electrolyte from the uncoated side of the metal foil.

Figure 8A:
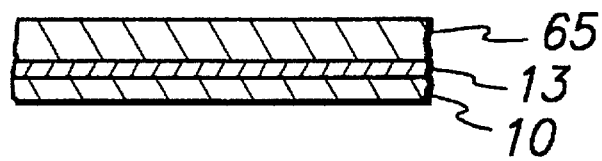
FIG. 8A is a schematic cross-sectional view of a coated sheet prepared in the apparatus illustrated in FIGS. 7 and 8.

As shown in FIG. 8A, the protected foil consists of consecutive layers of metal substrate 10, alkali metal coating anode 13 and polymerized electrolytic coating 65. In the present invention, the electrolyte separator is applied to the anode metal, such as lithium, in a liquid form and polymerized while in contact with the anode. The polymerized coating protects the alkali metal surface from contamination, attack by atmospheric compounds, or mechanical damage. The electrolyte coating also functions as a suitable electrolytic separator in solid state rechargeable electrochemical cells. The electrochemical cell can be completed by placing a suitable cathode in intimate contact with the polymeric electrolyte coating on the alkali metal coated metal foil, thus forming a cell consisting of consecutive layers of metal foil, anode, polymeric electrolytic separator and cathode.

III. Protection of Vacuum Metallized Coatings of Lithium by Laminating with a Cathode Covered Polymeric Electrolyte A method and apparatus for protecting the alkali metal surface of an alkali metallized foil with a cathode/electrolyte laminate is illustrated in FIG. 9. The protected vacuum metallized film on take-up roll 48 in the chamber 21 can be fed into a chamber 80 once the chambers 21 and 80 are connected, and air and moisture are expelled from the chamber 80 by venting chamber 80 with a noble through valves 120 and 121.

The vacuum metallized film is guided from the take-up roll 48, between guide rolls 81 and 82, through compression rolls 83 and 84, between laminating belts 85 and 86, through guide rolls 87 and 88, to take-up roll 90. A noble gas environment is maintained in the joint chambers 21 and 80.

A cathode laminate 91 consisting of a cathode layer and a polymerized electrolytic separator layer can be fed through an optional gas lock chamber 92 into chamber 80 through appropriate seals 95 and 96. Suitable cathode/electrolytic separator laminates are disclosed in Fauteux '317. A noble gas environment is preferably maintained in the chamber 92 through valves 93 and 94 to prevent air or moisture contamination of the environment in the joint chambers 21 and 80. The laminate 91 is oriented so that the electrolytic layer contacts the alkali metal coated surface of foil 14 at compression rolls 83 and 84. The laminating belts 85 and 86 exert sufficient pressure to form intimate contact between the alkali metal coating on the metal foil 14, and the electrolytic separator layer of the laminate 91.

Figure 9A:
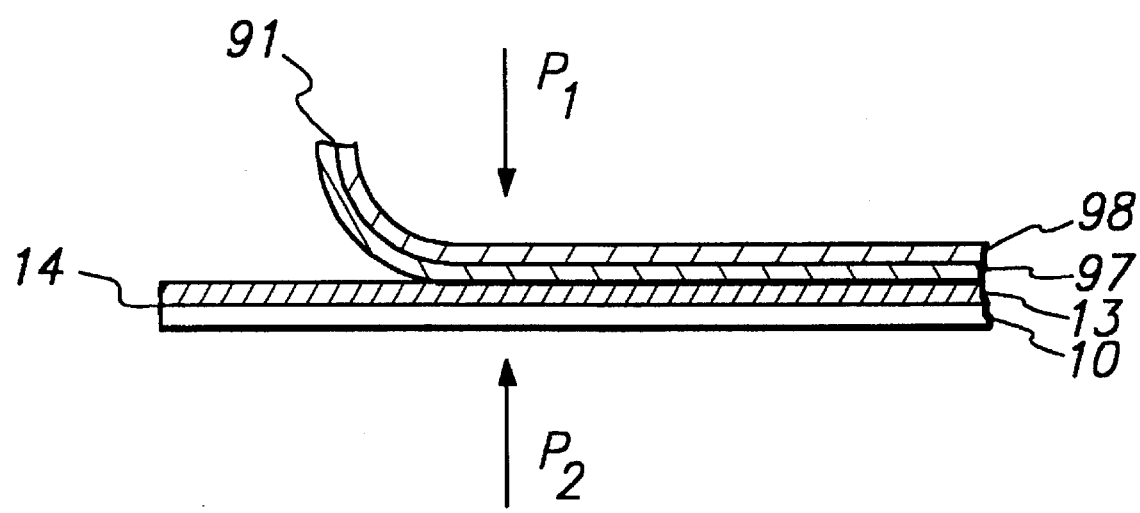
FIG. 9A is a schematic cross-sectional view of a laminated sheet prepared in the apparatus illustrated in FIG. 9.
Figure 9:
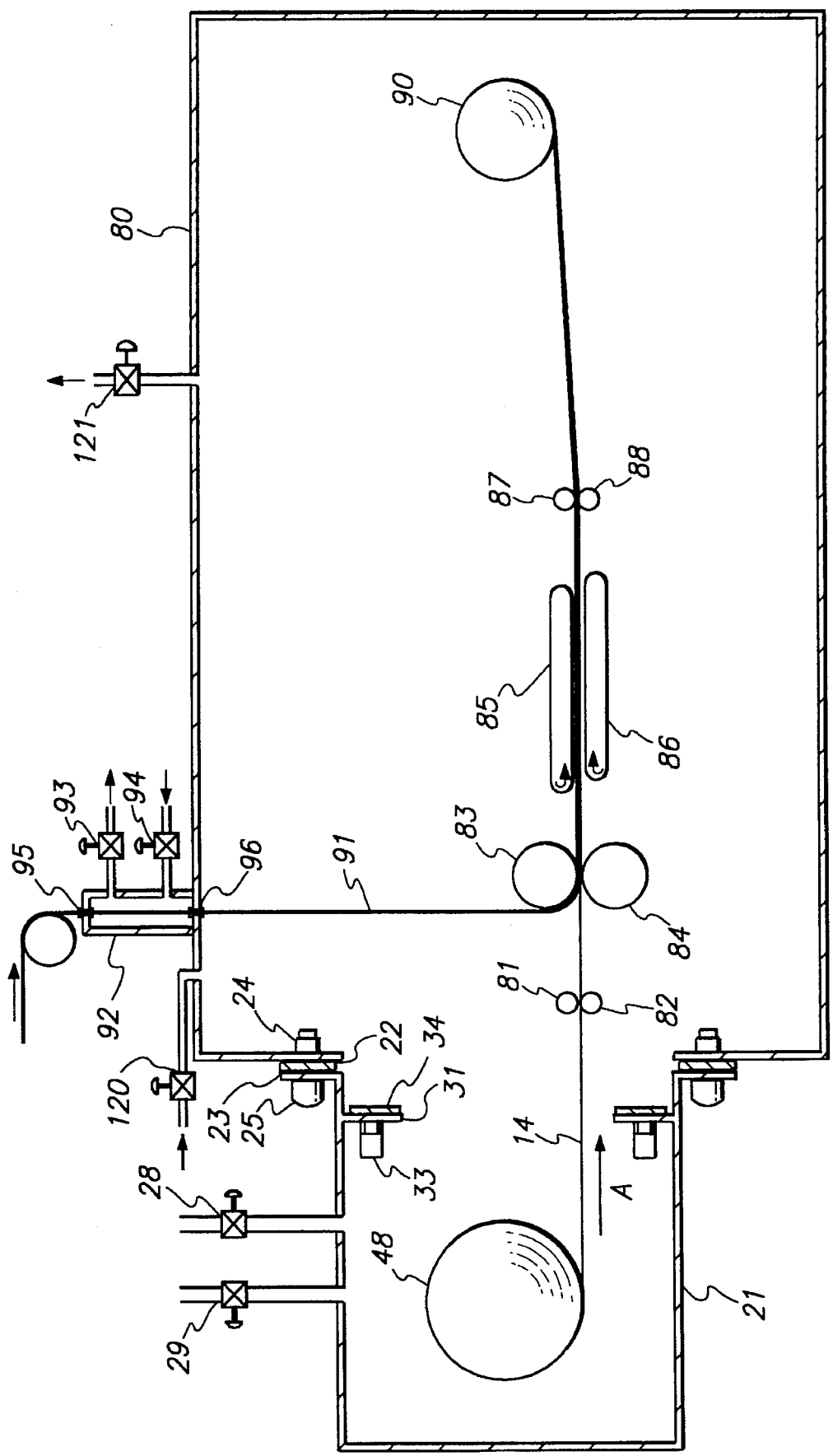
FIG. 9 is a schematic cross-sectional view illustrating an apparatus for laminating vacuum metallized substrate, collected and stored in a detachable chamber, with a laminate consisting of a cathode layer and an electrolytic separator layer.

As shown in FIG. 9A, the resulting laminate on the take-up roll 90 consists of consecutive layers of metal foil 10, anode coating 13, electrolytic separator 97 and cathode 98. Arrows $P_1$ and $P_2$ indicate the direction in which laminating pressure is applied. All that needs to be done to provide solid state rechargeable electrochemical cells is to cut the resulting laminate to size and attach terminals to the anode and the cathode.

IV. Continuous Vacuum Metallizing and Coating with Polymeric Electrolyte

Figure 10:
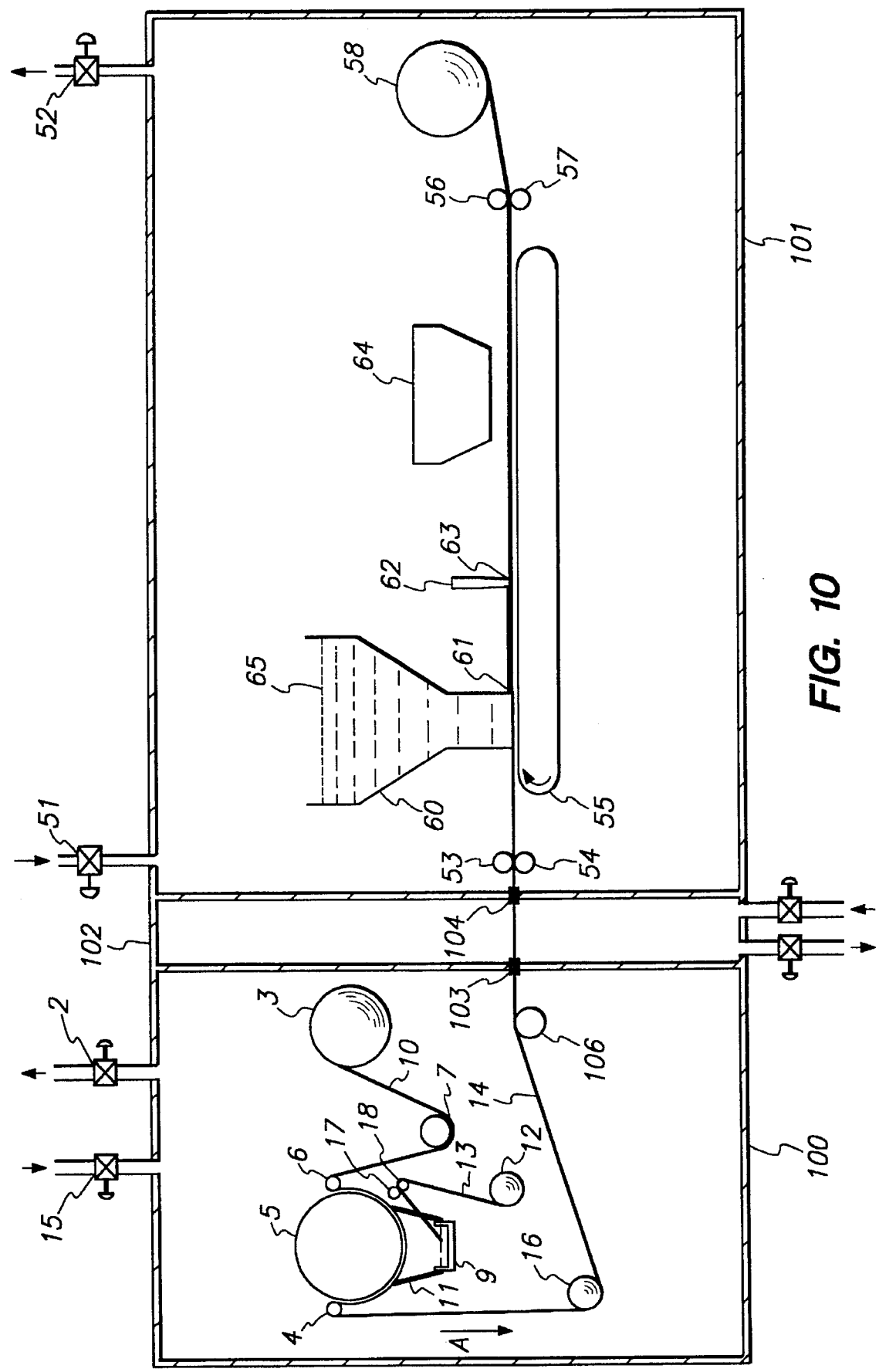
FIG. 10 is a schematic cross-sectional view illustrating an apparatus for the continuous metallizing of substrate with alkali metal and polymeric electrolyte coating of the alkali metal coated substrate.

A process and apparatus for continuous vacuum metallizing and coating with polymeric electrolyte is illustrated in FIG. 10.

In this method, a metal foil is vacuum coated with lithium or other alkali metal as described in connection with FIG. 3, but instead of collecting the vacuum metallized film on a take-up roll, it can be guided by guide roll 106 and is passed through a seal in the wall of a vacuum chamber 100 into a polymeric coating chamber 101 which contains a noble gas at approximately atmospheric pressure. The polymeric coating is applied as described in connection with FIG. 7 and 8.

The vacuum metallizing chamber 100 and the polymeric coating chamber 101 may be separated by one or more vacuum chambers 102, through which the vacuum metallized film passes through seals 103 and 104 in the walls of the vacuum metallizing chamber and the laminating chamber respectively.

Appropriate types of seals 103 and 104 are described in connection with FIG. 1. One or more additional vacuum chambers assist in maintaining a high vacuum in the vacuum metallizing chamber 100 without contamination due to volatile organic compounds present in the polymeric coating chamber 101.

V. Continuous Vacuum Metallizing and Laminating of Cells

Figure 11:
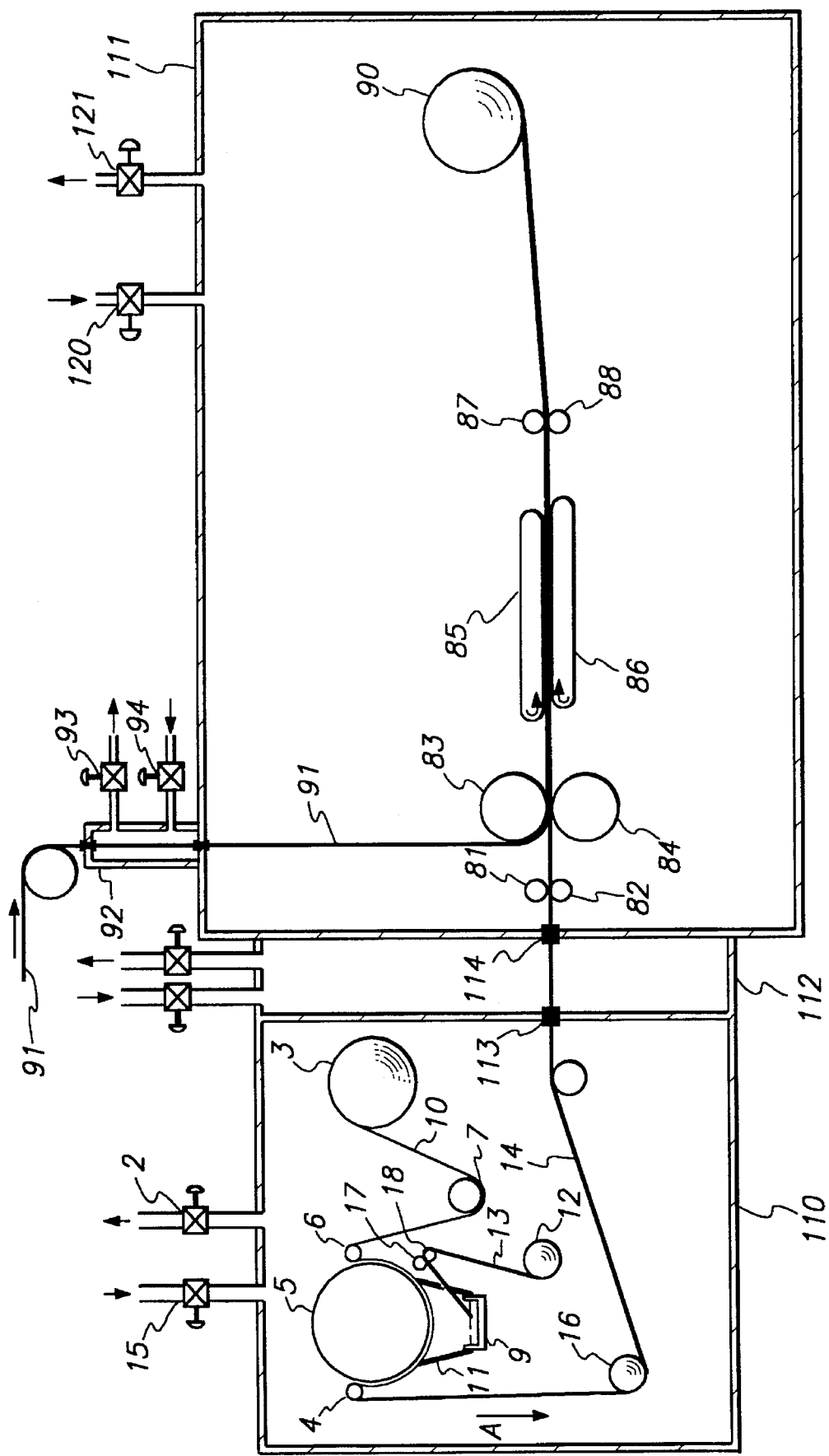
FIG. 11 is a schematic cross-sectional view illustrating an apparatus for the continuous preparation of a cell laminate through continuous metallizing of substrate with alkali metal and laminating of the alkali metal coated substrate.

A process and apparatus for continuous vacuum metallizing and laminating of solid state rechargeable electrochemical cells is shown in FIG. 11.

In this process, a metal foil is vacuum coated with lithium or other alkali metal as described in connection with FIG. 3, but instead of collecting the vacuum metallized film on a take-up roll, it is passed through a seal in the wall of a vacuum chamber 110 into a laminating chamber 111. The cathode and electrolytic separator laminate 91 are laminated to the anode side of the vacuum metallized foil as described in connection with FIG. 9.

The vacuum metallizing chamber 110 and the laminating chamber 111 may be separated by one or more vacuum chambers 112, through which the vacuum metallized film passes through seals 113 and 114 in the walls of the vacuum metallizing chamber and the laminating chamber respectively. One or more additional vacuum chambers assist in maintaining a high vacuum in the metallizing chamber 110 without contamination due to volatile organic compounds present in the polymeric coating chamber 111.

Appropriate types of seals 113 and 114 are described in connection with FIG. 1.

Figure 12:
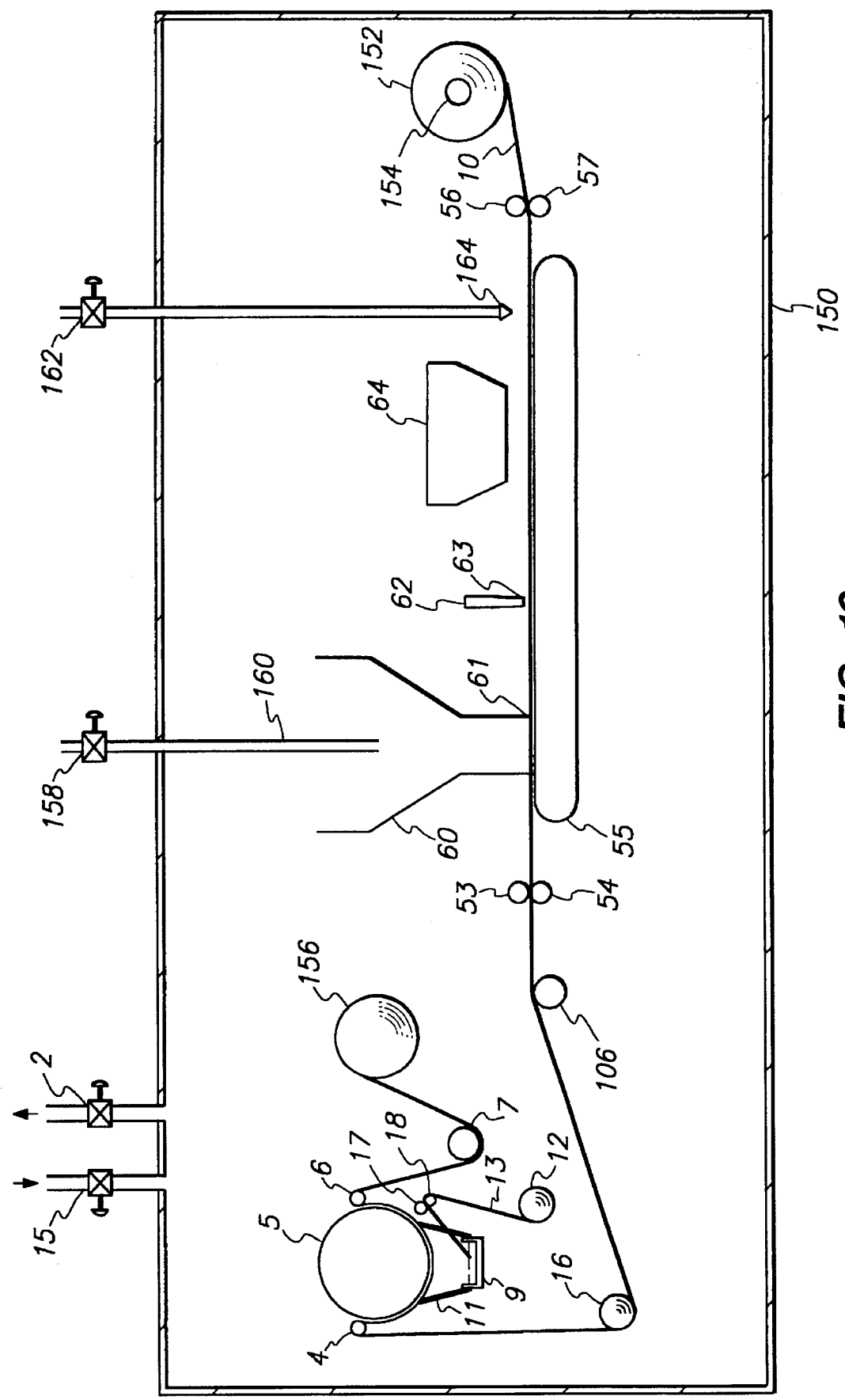
FIG. 12 is a schematic cross-sectional view depicting an apparatus for vacuum metallizing of continuous lengths of metal substrate, and subsequent coating with aprotic solvent or polymeric electrolytic separator in a noble gas environment within the vacuum metallizing chamber.

VI. Vacuum Metallizing Alkali Metals on Continuous Lengths of Metal Substrate and Subsequent Application of a Protective Coating The two stage process and apparatus illustrated in FIG. 12 shows an alternate embodiment of the present invention wherein vacuum metallizing with alkali metal and protective coating are performed within the same chamber. This technique minimizes handling of the lithium coated metal substrate, thus resulting in improved protection against contamination and lower manufacturing costs.

Referring to FIG. 12, the first stage consists of vacuum metallizing lithium or other alkali metal onto a continuous length of metal substrate (using techniques similar to those described in connection with FIG. 3) in vacuum chamber 150. This chamber has gas impervious walls and appropriate sealable openings (not shown) to load and unload the chamber. A supply roll 152 of suitable metal substrate foil or sheet 10 is placed inside the chamber 150. The inner end of the metal substrate foil inside supply roll 152 is removably attached to spindle 154 located at the core of the supply role 152. The substrate 10 can be guided between guide rolls 56 and 57, then between guide rolls 53 and 54, over guide rolls 106 and 16 and via quench roll 5 to take-up roll 156.

Valves 15, 158 and 162 are closed and vacuum is applied to chamber 150 through valve 2. Once a vacuum of at least $10^{-3}$ Torr is achieved, the metal substrate is continuously moved from supply roll 152 to take-up roll 156 while lithium is vacuum metallized onto the substrate in the manner described in connection with FIG. 3. During this processing stage elements 55, 60, 61, 62, 63, 64, 160 and 164 are not used. Once the supply roll 152 is depleted the vacuum metallizing process is stopped and the metal substrate remains attached to spindle 154.

During the second stage of the process shown in FIG. 12, valve 15 is closed and noble gas is admitted to chamber 250 through valve 2 until the chamber gas pressure is approximately equal to atmospheric pressure. Vacuum metallized substrate is then continuously moved through the appratus from take-up roll 156 to spindle 154 while applying a protective coating to the alkali metal surface of the foil. A noble gas environment is maintained throughout the coating process.

In one embodiment of the protective coating process, polymerizable electrolyte mixture is admitted to container 60 through valve 158 and conduit 160. The coating and polymerization process can then be conducted as described in connection with FIGS. 7 and 8.

In another coating embodiment, an aprotic solvent (such as, for example, propylene carbonate or other solvent suitable for use in solid state electrochemical cells) is sprayed onto the alkali metal coated surface of the metal foil. In this embodiment, elements 60, 61, 62, 63, 64 and 160 are not used.

VII. Substrate Composition

The present invention has been illustrated by using metal substrates as the electrically conductive substrate. While this is a preferred embodiment, the invention is also operable when the substrate consists of an electrically conductive plastic film or foil. Typical examples of electrically conductive plastic foil are: (1) polymer foil having conductive particles (e.g., conductive carbon black) dispersed therein, (2) foil comprising an electrically conductive polymer and (3) plastic foil having an electrically conductive coating (e.g., metallized plastic film).

The invention has been described in terms of the preferred embodiment. One skilled in the art will recognize that it would be possible to construct the elements of the present invention from a variety of means and to modify the placement of components in a variety of ways. While the preferred embodiments have been described in detail and shown in the accompanying drawings, it will be evident that various further modifications are possible without departing from the scope of the invention as set forth in the following claims.

I claim:

1. A method for vacuum metallizing in a vacuum metallizing chamber an alkali metal onto a moving electrically conductive metal substrate comprising the steps of:

evaporating said alkali metal at a first location by heating said alkali metal in a vacuum to form a vapor of said alkali metal;

moving a length of said conductive metal substrate continuously from a second location through said vapor to a third location;

condensing said vapor on a first surface of said conductive metal substrate at said first location to form a coated substrate; and collecting said coated substrate at said third location whereby said first surface of said substrate is provided with a substantially continuous coating of said alkali metal along substantially its first surface, whereby said substrate and coating can be used as an anode electrode for an electrochemical cell.

2. The method according to claim 1 wherein the substrate is a metal foil selected from the group consisting of copper, nickel, titanium, stainless steel, chrome plated steel and nickel plated steel.

3. The method according to claim 1 wherein the substrate is an electrically conductive plastic foil selected from the group consisting of a polymer having conductive particles dispersed therein, electrically conductive polymer and plastic foil having an electrically conductive metal coating.

4. The method according to claim 1 wherein the alkali metal is selected from the group consisting of lithium and lithium alloys.

5. The method according to claim 1 wherein the thickness of the alkali metal coating ranges from about 8 microns to about 25 microns.

6. The method according to claim 1 wherein the thickness of the conductive substrate ranges from about 9 microns to about 16 microns.

7. The method according to claim 1 wherein the vacuum pressure is less than about $10^{-5}$ Torr.

8. The method according to claim 1 wherein said alkali metal is evaporated by heating using one or more means selected from the group consisting of electrical resistance heating, electrical induction heating, electron beam heating and laser heating.

9. The method according to claim 1 wherein the alkali metal vapor is condensed on the substrate by contacting the substrate with a cooled surface as the substrate passes through the vapor.

10. The method according to claim 1 additionally comprising the step of preventing the surface of the alkali metal coating on said substrate from reacting with a normal atmosphere.

11. The method according to claim 10 wherein said alkali metal coating is prevented from reacting with a normal atmosphere by a process comprising the steps of:

collecting said coated substrate at said third location whereby said third location is located in a detachable chamber which is in communication with said metallizing chamber;

providing a noble gas to said metallizing chamber at approximately atmospheric pressure;

closing the detachable chamber with a chamber closure means whereby the interior of said detachable chamber is isolated from the interior of said metallizing chamber; and removing the detachable chamber from the metallizing chamber.

12. The method according to claim 10, wherein said alkali metal coating is prevented from reacting with a normal atmosphere by a process comprising the steps of:

moving a length of said substrate with said alkali metal coating to a fourth location in a noble gas atmosphere;

applying a layer of an ionically conducting polymerizable compound to said alkali metal coating at said fourth location;

moving said substrate coated with said polymerizable compound to a fifth location in a noble gas atmosphere; and polymerizing said polymerizable compound at said fifth location to form a polymer coated sheet comprising consecutive layers of ionically conducting polymeric compound, alkali metal and electrically conductive substrate.

13. The method according to claim 12 wherein said ionically conducting polymerizable compound comprises;

a polymerizable monomer;

an ionizable salt; and an aprotic solvent.

14. The method according to claim 12, wherein said polymerizing is performed by radiation.

15. The method according to claim 14 wherein said ionically conducting polymer compound layer comprises:

a polymer;

an ionizable salt; and an aprotic solvent.

16. The method according to claim 10, wherein said alkali metal coating is prevented from reacting with a normal atmosphere by a process comprising the steps of:

moving a length of said substrate with said alkali metal coating to a fourth location in a noble gas atmosphere;

pressing a cathode laminate onto said coated substrate at said fourth location to form an electrochemical cell laminate, said cathode laminate comprising a cathode coated with an ionically conducting polymeric compound whereby said ionically conducting compound is placed in intimate contact with, and covering essentially the entire surface of, said alkali metal coating.

17. The method according to claim 10 wherein said step of preventing the alkali metal coating surface from reacting with a normal atmosphere is performed within the vacuum metallizing chamber comprising the steps of:

providing a noble gas to said metallic chamber at approximately atmospheric pressure;

providing a protective coating substance to a fourth location within said chamber where said protective coating substance is selecting from the group consisting of ionically conducting polymerizable compound and aprotic solvent;

moving a length of said substrate with said alkali metal coating to said fourth location; and applying a layer of said substance to said alkali metal coating at said fourth location.

18. The method according to claim 17 wherein said polymerizable substance is polymerized comprising the steps of:

providing a radiation polymerizing means at a fifth location inside said chamber;

moving a length of said substrate coated with said polymerizable compound to said fifth location; and polymerizing said polymerizable compound using said polymerizing means at said fifth location to form a polymer coated sheet comprising consecutive layers of ionically conducting polymeric compound, alkali metal and electrically conductive substrate.

19. A method for producing an alkali metal coated electrically conductive metal substrate which is prevented from reacting with a normal atmosphere comprising the steps of:

evaporating an alkali metal inside a vacuum chamber at a first location by heating said alkali metal in a vacuum to form a vapor of said alkali metal;

continuously moving a length of said conductive metal substrate in said vacuum chamber from a second location through said vapor to a third location;

condensing said vapor on a first surface of said conductive metal substrate at said first location to form a coated substrate, whereby said first surface of said substrate is provided with a substantially continuous coating of said alkali metal along substantially its entire first surface;

guiding said coated substrate at said third location through a vacuum tight seal in a partition wall between said vacuum chamber and a coating chamber containing a noble gas at approximately atmospheric pressure, to a fourth location inside said coating chamber; and protectively coating said alkali metal coating inside said coated chamber at said fourth location, whereby said substrate and coating can be used as an anode electrode for an electrochemical cell.

20. The method according to claim 19 wherein said substrate is a metal foil selected from the group consisting of copper, nickel, titanium, stainless steel, chrome plated steel and nickel plated steel.

21. The method according to claim 19 wherein said substrate is an electrically conductive plastic foil selected from the group consisting of a polymer having conductive particles dispersed therein, electrically conductive polymer and plastic foil having an electrically conductive metal coating.

22. The method according to claim 19 wherein the alkali metal is selected from the group consisting of lithium and lithium alloys.

23. The method according to claim 19 wherein the thickness of the alkali metal coating ranges from about 8 microns to about 25 microns.

24. The method according to claim 19 wherein the thickness of the electrically conductive foil ranges from about 9 microns to about 16 microns.

25. The method according to claim 19 wherein said alkali metal is evaporated by heating using one or more means selected from the group consisting of electrical resistance heating, electrical induction heating, electron beam heating and laser heating.

26. The method according to claim 19 wherein coating the alkali metal coating to prevent said alkali metal coating from reacting with a normal atmosphere comprises the steps of:

moving said coated substrate from said fourth location to a coating means at a fifth location inside said coating chamber;

applying a layer of an ionically conducting polymerizable compound to said alkali metal coating using said coating means at said fifth location; and moving said coated substrate from said fifth location to a sixth location which provides a polymerizing means, where said polymerizable compound is polymerized by said polymerizing means to form a polymer coated sheet consisting of consecutive layers of ionically conducting polymeric compound, alkali metal and electrically conductive substrate.

27. The method according to claim 26 wherein said ionically conducting polymerizable compound comprises:

a polymerizable monomer;

an ionizable salt; and an aprotic solvent.

28. The method according to claim 19 wherein protectively coating the coated substrate comprises the steps of:

moving said substrate from said fourth location to a laminating means at a fifth location inside said coating chamber;

applying a cathode laminate to the surface of said coated substrate, said cathode laminate comprising a cathode layer and an ionically conducting polymeric compound layer, said cathode laminate oriented so that the ionically conducting layer contacts with, and substantially covers the entire surface of said alkali metal coated substrate; and applying pressure to compress said cathode laminate onto said coated substrate at said fifth location to form an electrochemical cell laminate consisting of consecutive layers of cathode, ionically conducting polymeric compound, alkali metal and electrically conductive substrate.

29. The method according to claim 28 wherein said ionically conducting polymeric compound comprises:

a polymer;

an ionizable salt; and an aprotic solvent.

30. A method for producing an alkali metal coated electrically conductive metal substrate which is prevented from reacting with a normal atmosphere comprising the steps of:

evaporating an alkali metal inside a vacuum chamber at a first location by heating said alkali metal in a vacuum to form a vapor of said alkali metal;

continuously moving a length of said conductive metal substrate in said vacuum chamber from a second location through said vapor to a third location;

condensing said vapor on a first surface of said conductive metal substrate at said first location, whereby said first surface of said substrate is provided with a substantially continuous coating of said alkali metal along substantially its entire first surface to form a coated substrate;

guiding said coated substrate at said third location through a vacuum tight seal in a partition wall between said vacuum chamber and a coating chamber containing a noble gas at approximately atmospheric pressure, to a location inside said coating chamber;

applying a cathode laminate to the surface of said coated substrate, said cathode laminate comprising a cathode layer and an ionically conducting polymeric compound layer, said cathode laminate oriented so that the ionically conducting layer contacts with, and substantially covers the entire surface of said alkali metal coated substrate; and applying pressure to compress said cathode laminate onto said coated substrate at said location inside said coating chamber to form an electrochemical cell laminate consisting of consecutive layers of cathode, ionically conducting polymeric compound, alkali metal and electrically conductive metal substrate.

31. The method according to claim 30 wherein said ionically conducting polymeric compound comprises:

a polymer;

an ionizable salt; and an aprotic solvent.

32. The method according to claim 30 wherein said substrate is a metal foil selected from the group consisting of copper, nickel, titanium, stainless steel, chrome plated steel and nickel plated steel.

33. The method according to claim 30 wherein the alkali metal is selected from the group consisting of lithium and lithium alloys.

34. The method according to claim 30 wherein the thickness of the alkali metal coating ranges from about 8 microns to about 25 microns.

35. The method according to claim 30 wherein the thickness of the electrically conductive substrate ranges from about 9 microns to about 16 microns.

36. The method according to claim 30 wherein said alkali metal is evaporated by heating using one or more means selected from the group consisting of electrical resistance heating, electrical induction heating, electron beam heating and laser heating.

37. The method according to claim 30 wherein the vacuum pressure is less than about $10^{-5}$ torr.

38. The method according to claim 30 wherein the alkali metal vapor is condensed on the substrate by contacting the substrate with a cooled surface as the substrate passes through the vapor.

* * * * *